United States Patent
Nguyen et al.

(10) Patent No.: US 7,808,089 B2
(45) Date of Patent: Oct. 5, 2010

(54) LEADFRAME HAVING DIE ATTACH PAD WITH DELAMINATION AND CRACK-ARRESTING FEATURES

(75) Inventors: Luu T. Nguyen, San Jose, CA (US); Vijaylaxmi Gumaste, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 314 days.

(21) Appl. No.: 11/959,412

(22) Filed: Dec. 18, 2007

(65) Prior Publication Data

US 2009/0152691 A1 Jun. 18, 2009

(51) Int. Cl.
*H01L 23/495* (2006.01)

(52) U.S. Cl. .............................. 257/676; 257/E23.043; 257/666; 257/667; 438/106

(58) Field of Classification Search .......... 257/E23.001, 257/E23.04, E21.502, 667, 676, 666, 735, 257/785, E23.043; 438/106, 112, 118
See application file for complete search history.

(56) References Cited

U.S. PATENT DOCUMENTS

| | | | | |
|---|---|---|---|---|
| 4,857,989 A | * | 8/1989 | Mori et al. | 257/666 |
| 5,053,855 A | * | 10/1991 | Michii et al. | 257/675 |
| 5,126,820 A | * | 6/1992 | Brown | 257/420 |
| 5,150,193 A | * | 9/1992 | Yasuhara et al. | 257/669 |
| 5,175,610 A | * | 12/1992 | Kobayashi | 257/676 |
| 5,397,915 A | * | 3/1995 | Nose | 257/676 |
| 5,578,871 A | * | 11/1996 | Fierkens | 257/676 |
| 5,750,423 A | * | 5/1998 | Ishii | 438/112 |
| 5,818,103 A | * | 10/1998 | Harada | 257/676 |
| 5,844,306 A | * | 12/1998 | Fujita et al. | 257/676 |
| 5,864,174 A | * | 1/1999 | Yamada et al. | 257/676 |
| 5,986,333 A | * | 11/1999 | Nakamura | 257/667 |
| 6,303,985 B1 | * | 10/2001 | Larson et al. | 257/676 |
| 6,306,684 B1 | * | 10/2001 | Richardson et al. | 438/118 |
| 6,329,706 B1 | * | 12/2001 | Nam | 257/666 |
| 6,388,311 B1 | * | 5/2002 | Nakashima et al. | 257/676 |
| 6,437,427 B1 | * | 8/2002 | Choi | 257/666 |

(Continued)

OTHER PUBLICATIONS

U.S. Appl. No. 11/372,481, filed Mar. 8, 2006.

(Continued)

*Primary Examiner*—Chris Chu
(74) *Attorney, Agent, or Firm*—Beyer Law Group LLP (57) ABSTRACT

One aspect of the invention pertains to a semiconductor package having a die and a die attach pad with a plurality of spaced apart pedestals supported by a web. A die is mounted on the die attach pad such that the die is supported by at least a plurality of the pedestals. Selected edge regions of the die are arranged to overlie recessed regions of the die attach pad between adjacent pedestals. The die is electrically connected to at least some of the contact leads. An adhesive is arranged to secure the die to the die attach pad, with the thickness of the adhesive between the web of the die attach pad and the die being greater than the thickness of the adhesive between the die and the top surfaces of the pedestals that support the die. The die attach pad may have rounded peripheral corners between adjacent edge surfaces of the die attach pad. In another aspect of the invention, a method of packaging integrated circuits is described, wherein the resulting packages include at least some of the aforementioned leadframe structures.

14 Claims, 8 Drawing Sheets

U.S. PATENT DOCUMENTS

| | | | | |
|---|---|---|---|---|
| 6,498,392 | B2* | 12/2002 | Azuma | 257/676 |
| 6,504,238 | B2* | 1/2003 | Cheng et al. | 257/676 |
| 6,639,306 | B2* | 10/2003 | Huang | 257/667 |
| 6,653,720 | B2* | 11/2003 | Kameda | 257/667 |
| 6,661,083 | B2* | 12/2003 | Lee et al. | 257/676 |
| 6,683,368 | B1 | 1/2004 | Mostafazadeh | 257/676 |
| 6,703,696 | B2* | 3/2004 | Ikenaga et al. | 257/678 |
| 6,713,849 | B2* | 3/2004 | Hasebe et al. | 257/667 |
| 6,750,546 | B1* | 6/2004 | Villanueva et al. | 257/778 |
| 6,849,933 | B2* | 2/2005 | Koike et al. | 257/676 |
| 6,891,254 | B2* | 5/2005 | Taniguchi | 257/667 |
| 7,001,798 | B2* | 2/2006 | Yamaguchi | 438/114 |
| 7,030,505 | B2* | 4/2006 | Kimura | 257/796 |
| 7,042,068 | B2* | 5/2006 | Ahn et al. | 257/666 |
| 7,145,222 | B2* | 12/2006 | Gai | 257/667 |
| 7,250,685 | B2* | 7/2007 | Shim et al. | 257/778 |
| 7,262,491 | B2* | 8/2007 | Islam et al. | 257/670 |
| 7,399,658 | B2* | 7/2008 | Shim et al. | 438/106 |
| 7,443,015 | B2* | 10/2008 | Punzalan et al. | 257/676 |
| 2005/0236701 | A1* | 10/2005 | Minamio et al. | 257/676 |
| 2007/0075404 | A1 | 4/2007 | Dimaano, Jr. et al. | 257/666 |

OTHER PUBLICATIONS

U.S. Appl. No. 60/971,997, filed Sep. 13, 2007.
U.S. Appl. No. 11/869,709, filed Oct. 9, 2007.
U.S. Appl. No. 11/869,708, filed Oct. 9, 2007.
Office Action dated Jun. 17, 2010 from U.S. Appl. No. 12/167,163.

* cited by examiner

LEADFRAME HAVING DIE ATTACH PAD WITH DELAMINATION AND CRACK-ARRESTING FEATURES

BACKGROUND OF THE INVENTION

The present invention relates generally to the packaging of integrated circuits (ICs). More particularly, a variety of leadframe designs suitable for use in packaging IC dice are described that facilitate stress reduction in and around an attached die.

There are a number of conventional processes for packaging integrated circuit (IC) dice. By way of example, many IC packages utilize a metallic leadframe. The leadframe typically includes a plurality of leads or contacts, and optionally a die attach pad (paddle) upon which a die may be physically attached by means of a suitable adhesive material. The die is typically electrically connected to the leadframe leads by appropriate connectors such as bonding wires. In general, the die and portions of the leadframe are encapsulated with a molding material to protect the electrical connections and the delicate electrical components on the active side of the die.

During testing and operation, packages may be repeatedly exposed to temperature cycling and other environmental stresses. By way of example, some testing protocols require cycling between temperatures as high as 125° C. and as low as −40° C. Such extreme changes in temperature may lead to delamination of the die from the die attach pad, which in turn may cause poor thermal performance, die cracking, the shearing of wirebonds attached to the die pad and other problems.

Figure 1A:
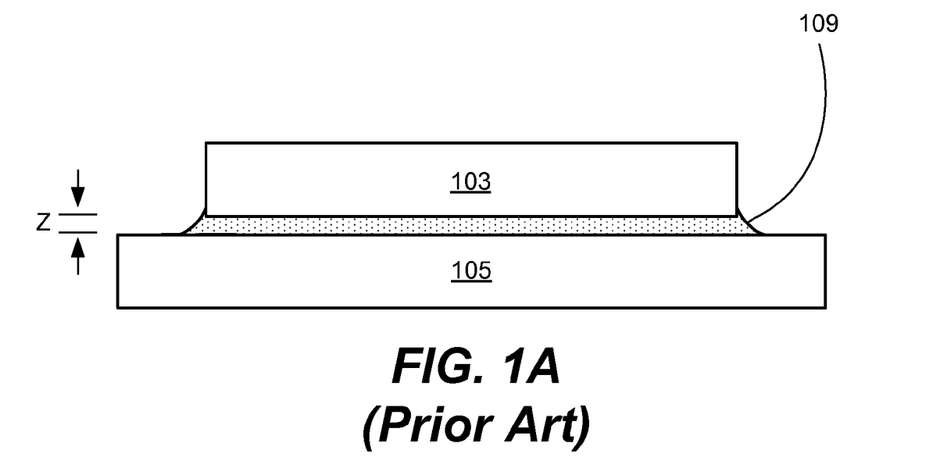
FIG. 1A is a diagrammatic side view of a die attached to a conventional leadframe die attach pad.
Figure 1B:
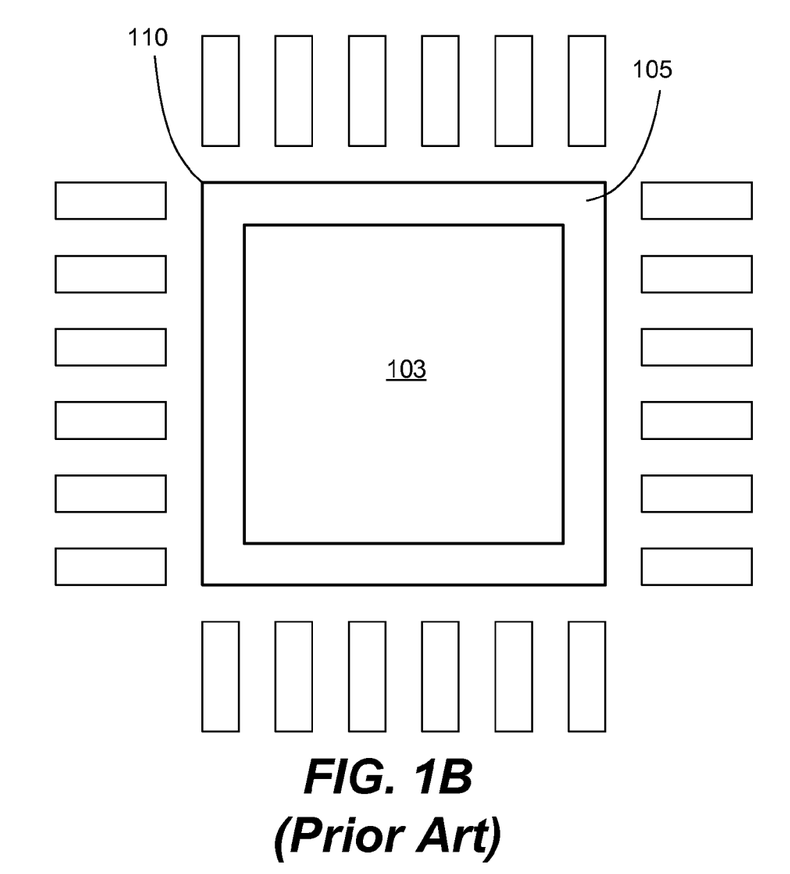
FIG. 1B is a diagrammatic top view of the die and die attach pad illustrated in FIG. 1A.

FIGS. 1A and 1B illustrate diagrammatic side and top views of a die 103 mounted on a conventional die attach pad 105. Adhesive 109 secures the die 103 to the conventional die attach pad 105. The depth Z of adhesive 109 between die attach pad 105 and die 103 is relatively constant across the bottom surface of die 103. As seen in FIGS. 1A and 1B standard die attach pads 105 tend to have a rectangular shape, a relatively smooth top surface without recesses, and sharp corners 110.

Figure 1C:
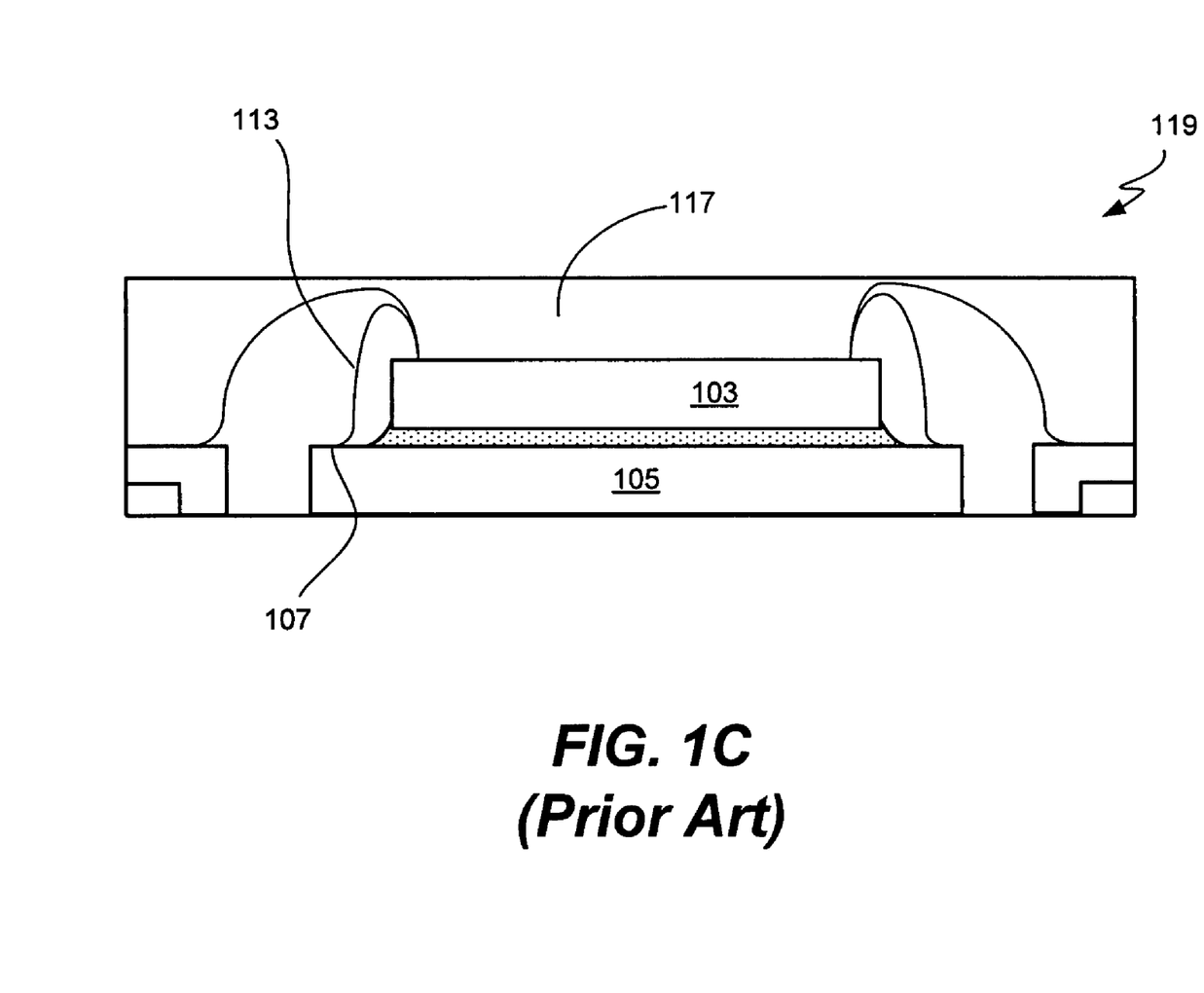
FIG. 1C is a diagrammatic side view of a package including the die and die attach pad illustrated in FIG. 1B.

FIG. 1C illustrates a diagrammatic side view of a package 119 that incorporates die 103 and die attach pad 105. Bonding wires 113 electrically connect die 103 to surface 107 of die attach pad 105. Molding material 117 encapsulates die 103 and die attach pad 105.

As noted earlier, the testing and operation of a package can damage the integrity of the package. Stresses tend to concentrate in sharp corners, such as corners 110 of FIG. 1B. Stresses may also concentrate on edges. Such stresses may result in delamination or cracking. The crack front may propagate, for example, from corner 110 of FIG. 1B into the interior of die attach pad 105, causing die attach pad 105 and die 103 to shift relative to one another. In package 119 of FIG. 1C, such cracking may cause die attach pad 105 and molding material 117 to shift relative to one another.

The shifting of die attach pad 105 relative to molding material 117 of FIG. 1C may cause a number of problems. Such shifting may cause bonding wires 113 to be disengaged from surfaces 107. Additionally, delamination between layers of the package may create air gaps within the package. Air gaps tend to reduce the thermal performance of package 119.

In view of the foregoing, there are continuing efforts to reduce stresses and to provide structures that reduce the probability of die delamination and other damage in IC packages.

SUMMARY OF THE INVENTION

In one aspect of the present invention, a semiconductor package includes a leadframe having a die attach pad and a plurality of contacts/leads is described. The die attach pad has recessed regions in its top surface that define a plurality of spaced apart pedestals supported by a web. A die is mounted on the die attach pad such that the die is supported by at least a plurality of the pedestals. Preferably, at least some edge regions of the die are arranged to overlie recessed regions of the die attach pad. The die is secured to the die attach pad using an adhesive that extends both over and around the pedestals that support the die. With this arrangement, the thickness of the adhesive between the web and the die is greater than the thickness of the adhesive between the die and the top surfaces of the pedestals that support the die.

In some preferred embodiments, the pedestals do not underlie any edge regions of the die. The size and geometry of the pedestals may vary widely. By way of example, circular, oval, substantially rectangular, square, diamond shaped, and other pedestal geometries may be used. In some embodiments, the corners of the die attach pad may be rounded to further reduce stress concentrations.

The die attach pad may also optionally include one or more bus bars defined in the top surface of the die attach pad. In some embodiments, the die is electrically connected to at least one bus bar such that the die attach pad functions as a contact. When multiple bus bars are employed, recessed regions may be provided between adjacent bus bars to facilitate the flow of encapsulant around the bus bars and into recessed regions of the die attach pad that are not filled by adhesive material.

In another aspect of the invention, a leadframe panel that incorporates a multiplicity of device areas each having the leadframe components (e.g., die attach pad and lead contacts) described above is contemplated. In some implementations, the device areas in the leadframe panel are arranged in at least one two-dimensional array of device areas.

In another aspect of the invention, a method of packaging integrated circuits utilizing a leadframe panel having properties similar to those set forth above is described. A die is adhesively adhered to the die attach pad such that the die is supported by at least a plurality of the pedestals. Selected edge regions of the die are arranged to overlie recessed regions of the die attach pad. With this arrangement, the thickness of the adhesive between the web of the die attach pad and the die is greater than the thickness of the adhesive between the die and the top surfaces of the pedestals that support the die. In some embodiments, the die is sized so that it does not cover all of the pedestals.

After mounting, the die may be electrically connected to the contact leads as appropriate and the die may be encapsulated using conventional techniques.

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

The present invention relates generally to the packaging of integrated circuits. As explained in the background section, the testing and operation of an integrated circuit (IC) package may subject the package to temperature extremes and other stresses. Such stresses may cause delamination and degrade the performance of the package. The present invention provides a semiconductor package and a method designed to help counteract such stresses and reduce delamination.

Figure 2A:
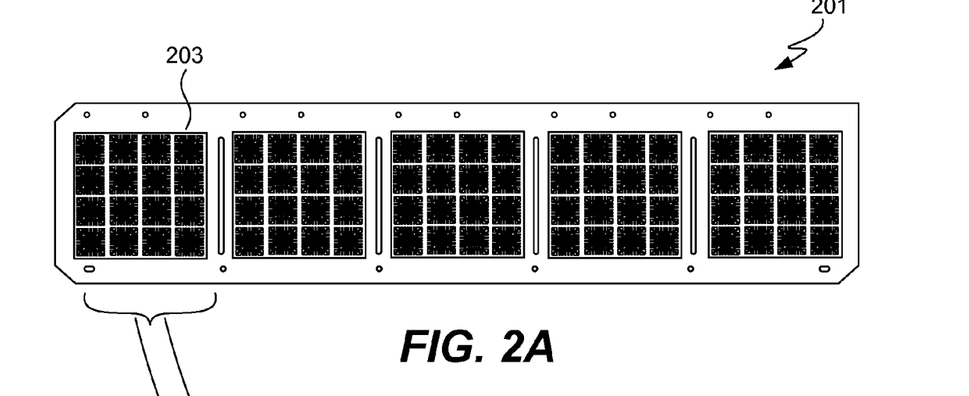
FIG. 2A is a diagrammatic top view of a leadframe strip or panel having a plurality of two-dimensional arrays of device areas defined therein.
Figure 2B:
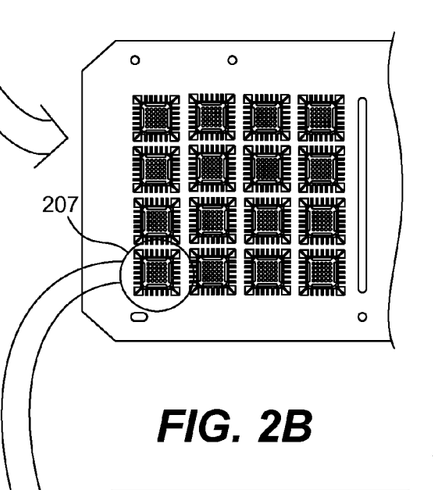
FIG. 2B is a diagrammatic enlarged top view of the leadframe strip illustrated in FIG. 2A showing a single one of the two dimensional arrays of device areas.
Figure 2C:
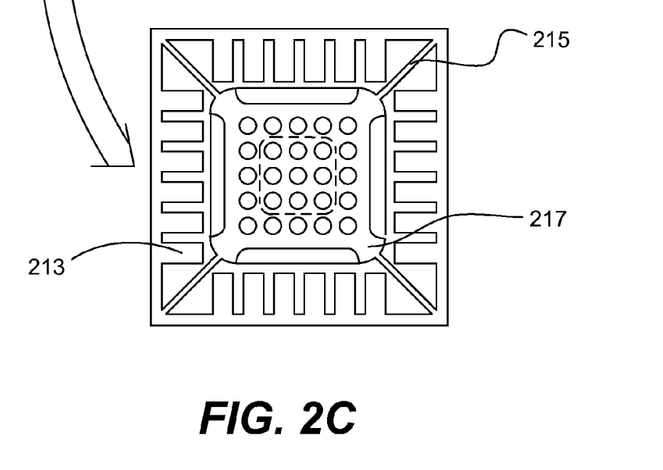
FIG. 2C is a diagrammatic enlarged top view of the leadframe that constitutes a single device area within the two dimensional array of device areas illustrated in FIG. 2B.

Referring next to FIGS. 2A-2C, an improved leadframe design in accordance with one aspect of the invention will be described. FIG. 2A is a diagrammatic top view of a leadframe strip suitable for use in packaging integrated circuits. Leadframe strip 201 is formed from a suitable conductive material. Typically the leadframe strip is formed from a metallic material such as copper, copper alloy, aluminum etc., although this is not a requirement. In the illustrated embodiment, the leadframe strip 201 has a number of sections 203 that each include a two-dimensional array of device areas 207. Each device area 207 includes tie bars 215, contact leads 213 and improved die attach pad 217.

Figure 3A:
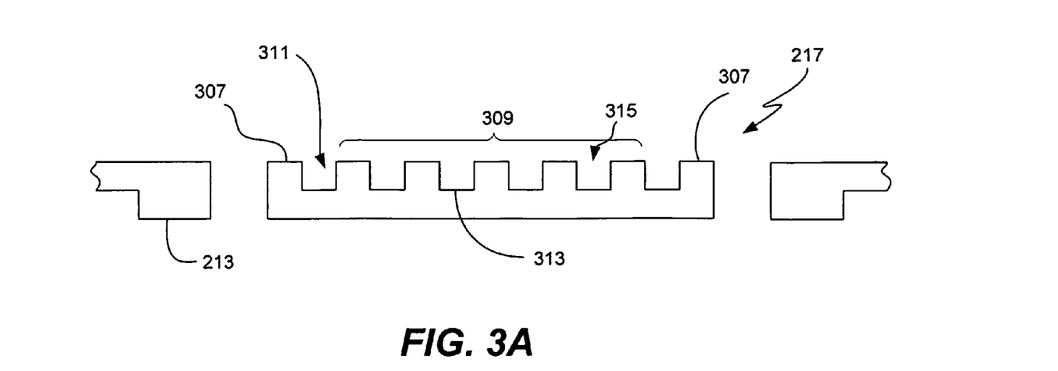
FIG. 3A is a diagrammatic side view of an improved die attach pad and contact leads in accordance with one embodiment of the present invention.

FIG. 3A is a diagrammatic side view of improved die attach pad 217 and contact leads 213, which may be formed using a variety of suitable techniques, including etching and stamping. Die attach pad 217 has recessed regions 311, which define one or more pedestals 309 and bus bars 307. Pedestals 309 and bus bars 307 are supported by web 313. There are gaps 315 between adjacent pedestals 309. Bus bars 307 may be arranged on the periphery or elsewhere on die attach pad 217. Some embodiments do not include bus bars. Recessed regions 311, pedestals 309, bus bars 307 and web 313 may be arranged in any number of ways. Some arrangements are discussed in more detail below.

Figure 3B:
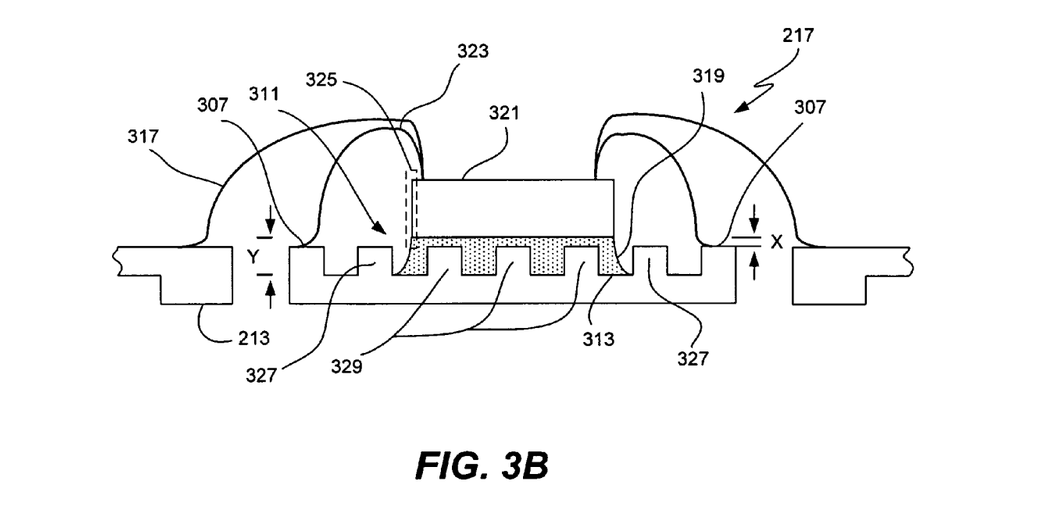
FIG. 3B is a diagrammatic side view of the die attach pad and contact leads illustrated in FIG. 3A, after a die, wires and adhesive have been added in accordance with one embodiment of the present invention.

FIG. 3B is a diagrammatic side view of die attach pad 217 and contact leads 213 after die 321, wires 317 and 323 and adhesive 319 have been added. Die 321 is mounted on die attach pad 217 such that die 321 is supported by interior pedestals 329. Interior pedestals 329, which are a subgroup of pedestals 309, underlie die 321. Peripheral pedestals 327, which are also a subgroup of pedestals 309, do not underlie die 321. In some embodiments, all pedestals underlie die 321. Die 321 may be supported by any number of pedestals. Edge regions 325 of die 321 are arranged to overlie recessed regions 311 of die attach pad 217. In other embodiments, only selected edge regions are arranged to overlie recessed regions 311. Preferably, pedestals 309 do not underlie edge regions 325 of die 321, although this is not a requirement.

Adhesive 319 secures die 321 to die attach pad 217. Adhesive 319 is arranged to secure die 321 to interior pedestals 329 and to web 313. The recesses underlying die 321 create cavities in which the adhesive 319 may collect. Thus, the thickness Y of adhesive 319 between web 313 and die 217 is greater than the thickness X of adhesive 319 between the top surface of interior pedestals 329 and die 321. The greater thickness Y of adhesive 319 strengthens the bond between die attach pad 217 and die 321. Such strengthening reduces the likelihood of delamination between die attach pad 217 and die 321.

Additionally, because edge regions 325 of die 321 are arranged to overlie recessed regions 311 of die attach pad 217, a particularly thick layer of adhesive 319 connects die attach pad 217 to edge regions 325 of die 321. As noted above, stresses tend to concentrate in areas around sharp corners and edges, such as edge regions 325. The relatively greater amount of adhesive 319 below edge regions 325 helps to counteract the additional stress that edge regions 325 may accumulate.

Bus bars 307 offer additional benefits. The top surfaces of bus bars 307, where wires 323 are connected, are not substantially co-planar with web 313 of die attach pad 217. Such a configuration contrasts with package 119 as illustrated in FIG. 1C, where surfaces 107, which receive groundbonding wires 113 from die 103, are substantially co-planar with the rest of the top surface of die attach pad 105. Since the top surfaces of bus bars 307 are not substantially co-planar with web 313 of die attach pad 217, a crack front propagating along web 313 may be prevented from shearing wires 323.

Figure 3C:
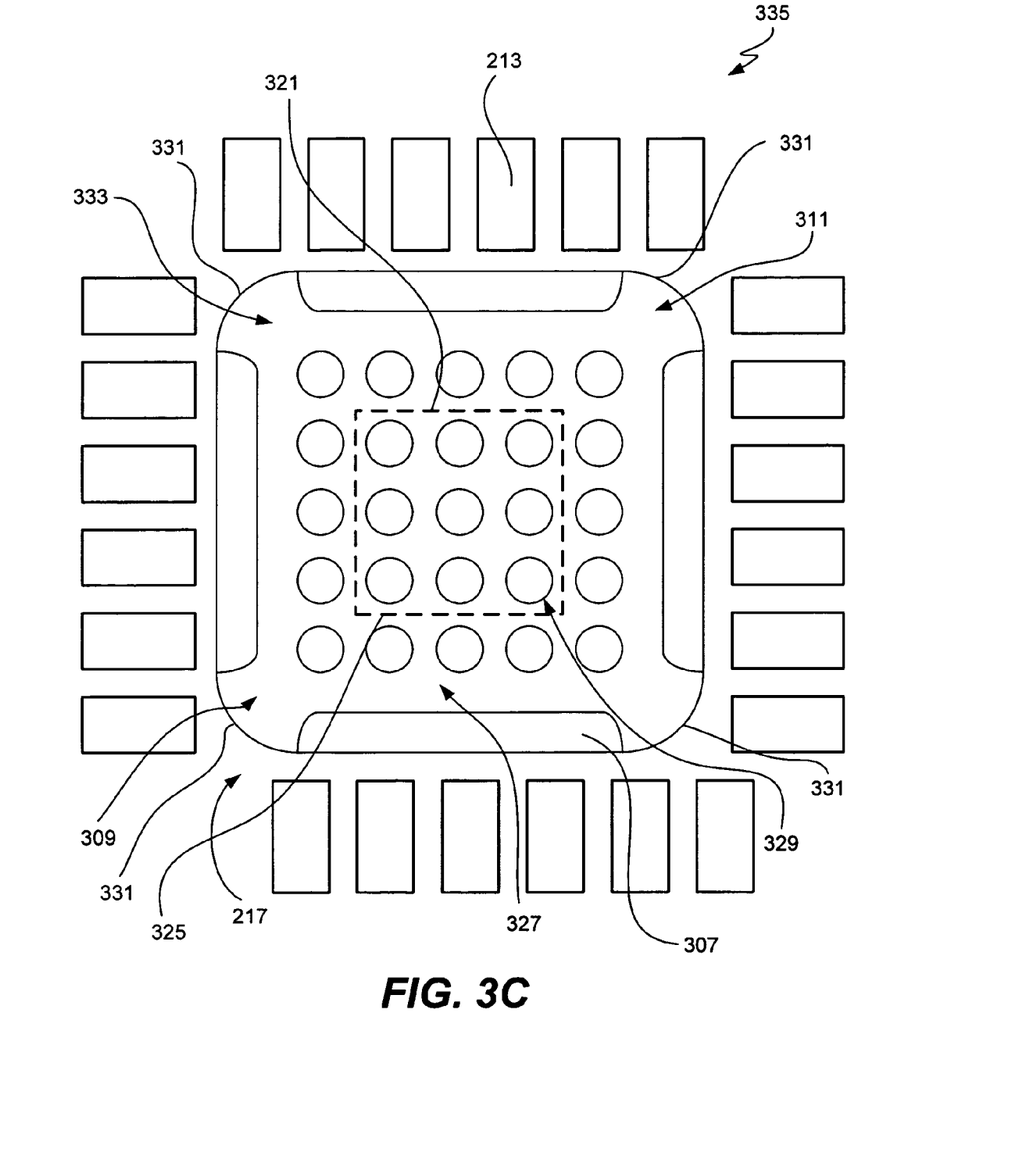
FIG. 3C is a diagrammatic top view of the die attach pad illustrated in FIG. 3B.

FIG. 3C is a diagrammatic top view of the structures illustrated in FIGS. 3A and 3B. Die 321 is indicated with a dotted line, revealing underlying interior pedestals 329. The dotted line also indicates edge regions 325 of the die.

Peripheral pedestals 327, which reside outside of the dotted line, are also shown. Peripheral pedestals 327 may be arranged in order to arrest cracking or delamination propagating from the periphery or corners 331 of die attach pad 217. By way of example, peripheral pedestals 327 may be arranged to surround die 321.

In the illustrated embodiment, die attach pad 217 has rounded peripheral corners 331 between adjacent edge surfaces of die attach pad 217. As noted earlier, sharp edges tend to accumulate stress, sometimes resulting in the initiation of delamination and cracking. The illustrated rounding reduces the sharpness of corners 331 as compared to, for example, corners 110 of conventional die attach pad 105 of FIG. 1B. The reduction in sharpness tends to reduce stress accumulation at corners 331 and help preserve the integrity of a package containing die attach pad 217.

Die attach pad 217 also has recessed regions 311, some which are situated between adjacent bus bars 307 thereby forming gaps 333 between adjacent bus bars 307. Bus bars 307, gaps 333 and/or recessed regions 311 are arranged to facilitate the flow of encapsulant around bus bars 307 and into recessed regions of die attach pad 217 that are not filled by adhesive material 319. Facilitating such a flow helps to eliminate voids in the resulting package. Voids may trap moisture, potentially reducing the performance and reliability of the package.

Various features of pedestals 309 should be appreciated. In the illustrated embodiment, pedestals 309 have substantially circular cross sections. Preferably, pedestals 309 have a diameter of 0.1 to 0.2 mm, although both larger and smaller pedestals may be used in different applications. The relative lack of sharp corners or edges on pedestals 309 reduces the accumulation of stresses at pedestals 309. Instead of being substantially circular, pedestals 309 may also be substantially rectangular, square, diamond shaped, or oval. Other shapes are also possible. Pedestals 309 may have sharp corners or substantially rounded corners. Pedestals 309 may vary in terms of number, size, shape, height, arrangement, pitch and in other ways.

Figure 4:
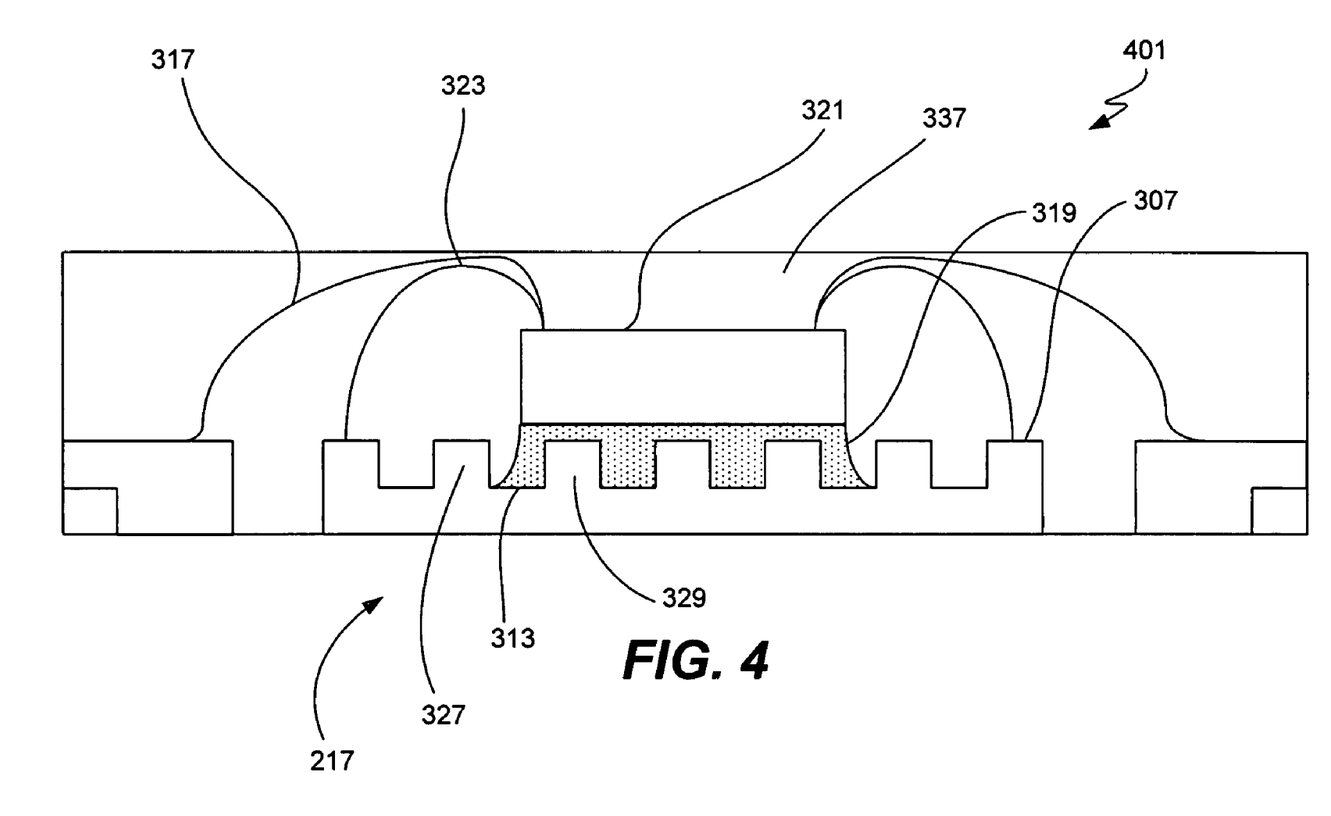
FIG. 4 is a diagrammatic side view of an IC package in accordance with an embodiment of the present invention.

FIG. 4 is a diagrammatic side view of an integrated circuit package 401 containing the structures illustrated in FIGS. 3B and 3C. Package 401 includes die 321 mounted upon die attach pad 217. Wires 323 connect die 321 to bus bars 307. Wires 317 connect die 321 to contact leads 213. Adhesive 319 secures die 321 to the top surfaces of interior pedestals 329 and web 313. Encapsulating material 337 encompasses at least in part peripheral pedestals 327 and bus bars 307.

Figure 5A:
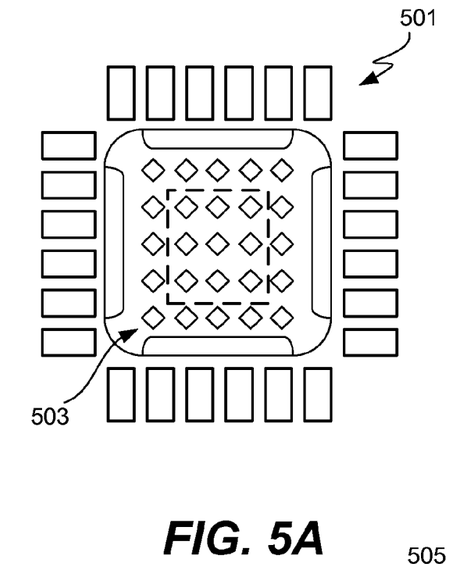
FIG. 5A is a diagrammatic top view of a leadframe die attach pad with substantially diamond-shaped pedestals.
Figure 5B:
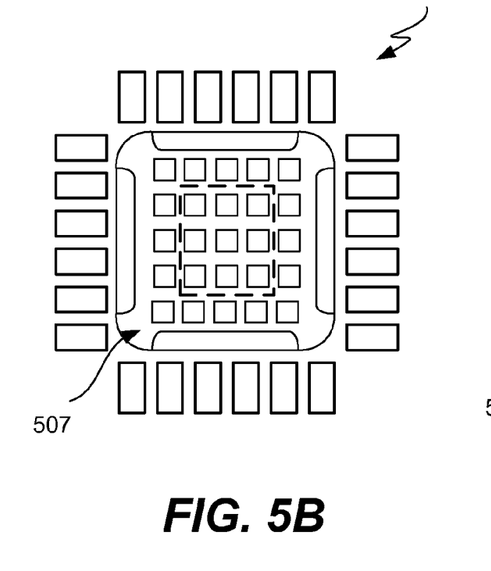
FIG. 5B is a diagrammatic top view of a leadframe die attach pad with substantially square-shaped pedestals.
Figure 5C:
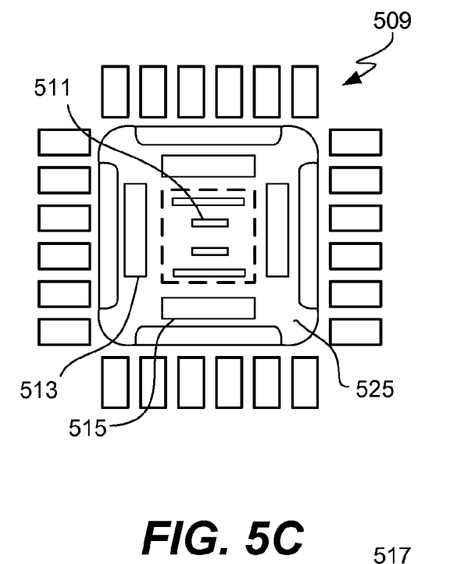
FIG. 5C is a diagrammatic top view of a leadframe die attach pad with substantially rectangular pedestals of various sizes.
Figure 5D:
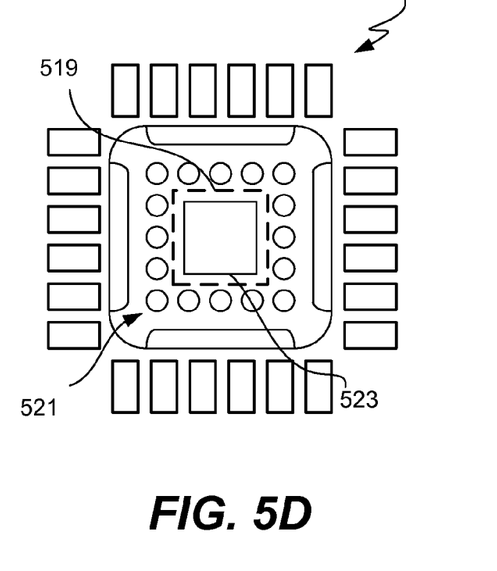
FIG. 5D is a diagrammatic top view of a leadframe die attach pad with substantially circular and square pedestals of various sizes.

FIGS. 5A-5D illustrate some embodiments featuring different arrangements of different kinds of pedestals. FIG. 5A, for example, is a diagrammatic top view of die attach pad 501 with substantially diamond shaped pedestals 503. FIG. 5B illustrates a diagrammatic top view of die attach pad 505 with substantially square shaped pedestals 507. FIG. 5C illustrates a diagrammatic top view of die attach pad 509 having a plurality of substantially rectangular pedestals 511, 513 and 515. Pedestals 511, 513 and 515 may be the same size or vary in size. Pedestals 511, 513 and 515 may vary in pitch. FIG. 5D is a diagrammatic top view of die attach pad 517, which also features pedestals of various shapes and sizes. A single larger pedestal 523 underlies and supports die 519, represented by the dotted line. Pedestal 523 is substantially rectangular shaped, but may feature rounded corners or assume a variety of different shapes. Peripheral pedestals 521 reside outside the periphery of die 519. The illustrated peripheral pedestals 521 are substantially circular in cross section, although again, the geometry of the peripheral pedestals may vary widely in accordance with the needs of any particular application. Peripheral pedestals 521 are arranged to arrest crack fronts propagating from the periphery into the interior of die attach pad. The pitch of pedestals 521 may affect such propagation.

It should be appreciated that FIGS. 5A-5D represent only some embodiments of the claimed invention. Other embodiments may include a variety of different configurations and structures. Some embodiments, for example, may include bus bars, recesses or pedestals of different dimensions or shapes. There may be fewer or more such structures. Some embodiments may place such structures in different locations on a die attach pad. Some embodiments involve the rounding of different edges or corners of a die attach pad.

Figure 6:
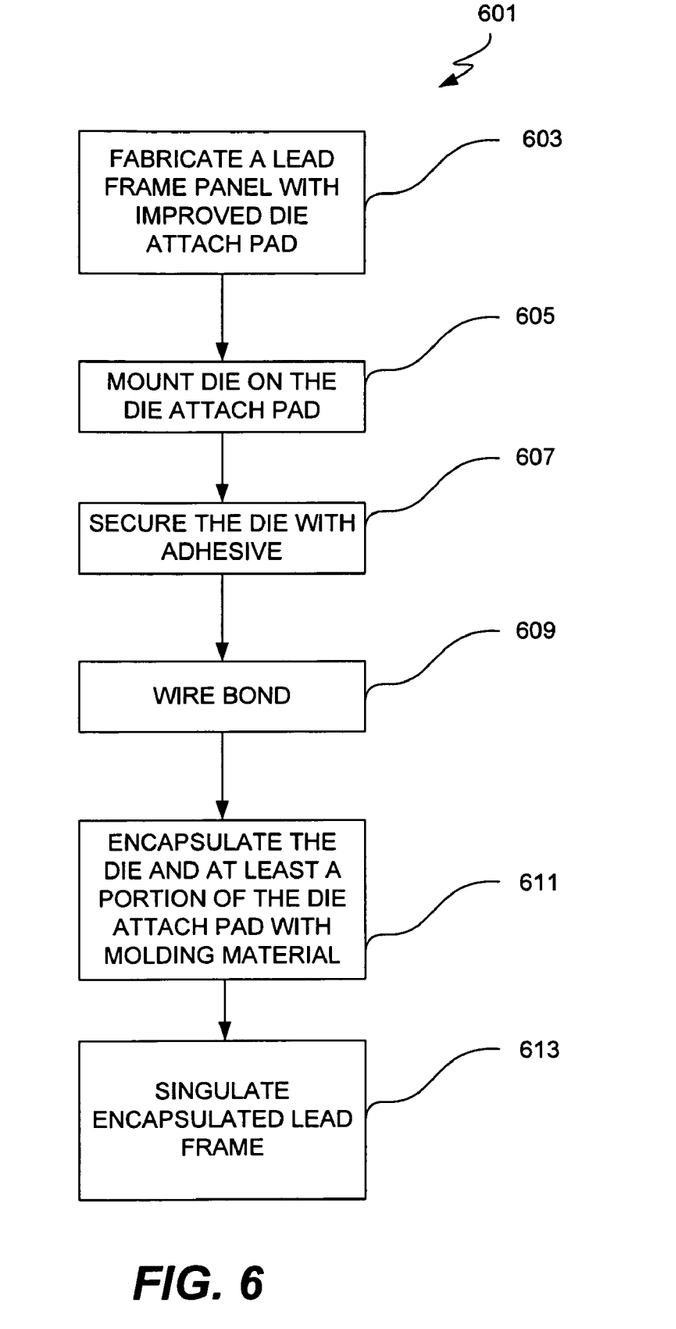
FIG. 6 is a flow chart illustrating a process for forming a leadframe panel in accordance with an embodiment of the present invention.

Referring next to the flow chart 601 presented in FIG. 6, one suitable approach for forming a leadframe panel will be described. Unless explicitly indicated otherwise, the operations described below may be performed concurrently or in any order. Operations may be added to or removed from flow chart 601.

Step 603 involves fabricating a leadframe panel with contact leads and a die attach pad that has recessed regions. The recessed regions may define a plurality of pedestals and a web. The recessed regions may also define a plurality of bus bars. The bus bars are preferably located on the periphery of the die attach pad. There may be gaps between adjacent bus bars. The gaps and bus bars may be arranged to facilitate the flow of encapsulant around the bus bars and into recessed regions of the attach pad. Step 603 may include any number of suitable techniques for forming a leadframe. The formation of the leadframe, for example, may involve etching or stamping.

Step 605 involves mounting a die on the die attach pad. The die may be supported by one pedestal or a first plurality of pedestals. Selected edge regions of the die are arranged to overlie recessed regions of the die attach pad. Preferably, a second plurality of pedestals do not underlie the die. The second plurality of pedestals may be arranged to restrict crack fronts propagating from the periphery into the interior of the die attach pad.

Step 607 involves securing the die with an adhesive. The adhesive may be applied so as to secure the die to the web and to the pedestals that support the die. The thickness of the adhesive between the web of the die attach pad and the die is preferably greater than the thickness of the adhesive between the die attach pad and the top surfaces of the pedestals that support the die.

Step 609 involves electrically connecting the die to selected contact leads. By way of example, I/O pads on the active surface of the die may be electrically connected with bonding portions of the contact leads with bonding wires and associated wire bonds. Flip chip type mounting or any other suitable electrical connection technique may be used.

Step 611 involves encapsulating the die and at least a portion of the die attach pad. Any number of suitable encapsulating materials may be used. The encapsulating technique may make use of the gaps between the bus bars. Preferably, encapsulating material flows through the gaps, at least partially around the bus bars and/or around one or more pedestals. In one embodiment, an entire populated leadframe strip, such as the leadframe panel illustrated in FIG. 2A, is placed in a mold such that all of the device areas of the panel may be encapsulated substantially at the same time. Any suitable system for encapsulation may be used in step 609.

Step 613 involves singulating the leadframe from the leadframe panel. Singulation may be performed using any number of suitable techniques. The encapsulated leadframe may be singulated, for example, using sawing.

Although only a few embodiments of the invention have been described in detail, it should be appreciated that the invention may be implemented in many other forms without departing from the spirit or scope of the invention. In the foregoing description, many of the described leadframes include leads and/or contacts, which are frequently referred to herein as contact leads. In the context of this invention, the term contact lead is intended to encompass leads, contacts and other electrical interconnect structures that may be present within a leadframe. Therefore, the present embodiments should be considered as illustrative and not restrictive and the invention is not limited to the details given herein, but may be modified within the scope and equivalents of the appended claims.

What is claimed is:

1. A semiconductor package comprising:
   a leadframe having a die attach pad and a plurality of contact leads, the die attach pad having a top surface and a bottom surface and recessed regions in the top surface of the die attach pad that define a multiplicity of pedestals supported by a web, each pedestal having a top surface, the top surfaces of the multiplicity of pedestals being substantially co-planar, there being gaps between adjacent pedestals;
   a die mounted on the die attach pad such that the die is supported by at least a plurality of the pedestals, wherein selected edge regions of the die are arranged to overlie recessed regions of the die attach pad, the die being electrically connected to at least some of the contact leads;
   an adhesive that secures the die to the die attach pad, wherein the adhesive is arranged to secure the die to the pedestals that support the die and to the web, wherein the thickness of the adhesive between the web and the die is greater than the thickness of the adhesive between the die and the top surfaces of the pedestals that support the die and wherein the thickness of the adhesive between the edge regions of the die and the web is greater than the thickness of the adhesive between the die and the top surfaces of the pedestals that underlie the die; and
   an encapsulant that encapsulates the die and at least a portion of the die attach pad.

2. A semiconductor package as recited in claim 1, wherein the plurality of pedestals do not underlie any edge regions of the die.

3. A semiconductor package as recited in claim 1 wherein the recessed regions further define at least one bus bar in the top surface of the die attach pad, wherein the die is electrically connected to the at least one bus bar such that the die attach pad functions as a contact.

4. A semiconductor package as recited in claim 3, wherein the die attach pad includes a plurality of bus bars defined in the top surface of the die attach pad, there being recessed regions between adjacent bus bars that facilitate the flow of encapsulant around the bus bars and into some of the recessed regions of the die attach pad that are not filled by adhesive material.

5. A semiconductor package as recited in claim 1, wherein the die attach pad has rounded peripheral corners between adjacent edge surfaces of the die attach pad.

6. A semiconductor package as recited in claim 1, wherein the pedestals each have substantially circular cross sections.

7. A semiconductor package as recited in claim 1, wherein the pedestals each have cross sectional geometries selected from the group consisting of substantially rectangular, substantially square, substantially diamond shaped, and substantially oval cross sections.

8. A semiconductor package as recited in 1, wherein the pedestals have rounded corners.

9. A semiconductor package as recited in claim 1, wherein the plurality of pedestals are not all of the same size.

10. A semiconductor package as recited in claim 1, wherein the pedestals are substantially circular and the diameter of the pedestals is in the range of approximately 0.1 and 0.2 millimeters.

11. A semiconductor package as recited in claim 1, wherein the die is mounted on the die attach pad such that some of the pedestals do not underlie the die.

12. The semiconductor package of claim 1, wherein:
    the die attach pad includes a recessed surface that is at a bottom of the recessed regions, wherein the multiplicity of pedestals rise independently out of the recessed surface, each pedestal having a base that is directly and integrally connected to the recessed surface, each pedestal extending from its base perpendicular to the recessed surface and terminating at the associated top surface of the pedestal.

13. The semiconductor package of claim 12, wherein the multiplicity of pedestals includes one or more peripheral pedestals, the top surfaces of the peripheral pedestals positioned outside the periphery of and not directly underlying the die, the bases of the peripheral pedestals positioned inside the periphery of the recessed surface of the die attach pad, the one or more peripheral pedestals arranged on the recessed surface to help arrest cracking that propagates along the recessed surface towards the die.

14. The semiconductor package of claim 12, wherein the multiplicity of pedestals includes a plurality of bus bar pedestals, the bus bar pedestals surrounding an inner region on the recessed surface of the die attach pad, the bus bar pedestals being separated from one another by gaps that extend down to the recessed surface, wherein the bus bar pedestals are arranged to allow molding material to flow adjacent to the recessed surface and through the gaps between the bus bar pedestals towards the inner region of the die attach pad.

* * * * *